United States Patent [19]

Olsson et al.

[11] 4,376,560

[45] Mar. 15, 1983

[54] SOCKET FOR A CERAMIC CHIP CARRIER

[75] Inventors: Billy E. Olsson, New Cumberland; James R. Kunkle, Enola; Lit-Yan Kam, Camp Hill, all of Pa.

[73] Assignee: AMP Incorporated, Harrisburg, Pa.

[21] Appl. No.: 216,727

[22] Filed: Dec. 15, 1980

[51] Int. Cl.³ .................................... H01R 13/639
[52] U.S. Cl. ............................. 339/17 CF; 339/75 M
[58] Field of Search ............ 339/17 CF, 75 R, 75 M, 339/176 M; 174/52 FP

[56] References Cited

U.S. PATENT DOCUMENTS

| | | | |
|---|---|---|---|
| 3,391,383 | 7/1968 | Antes | 339/174 |
| 3,454,921 | 7/1969 | Coleman | 339/17 CF |
| 3,700,788 | 10/1972 | Spurck | 174/52 S |
| 3,753,211 | 8/1973 | Pauza et al. | 339/75 MP |
| 3,846,734 | 11/1974 | Pauza et al. | 339/17 CF |
| 3,846,737 | 11/1974 | Spaulding | 339/174 |
| 3,873,173 | 3/1975 | Anhalt | 339/17 CF |
| 3,904,262 | 9/1975 | Cutchaw | 339/17 CF |
| 3,951,495 | 4/1976 | Donaher | 339/17 CF |
| 3,953,101 | 4/1976 | Palecek | 339/174 |
| 4,035,046 | 7/1977 | Kloth | 339/17 CF |
| 4,257,661 | 3/1981 | Dalamangas et al. | 339/75 MP |

*Primary Examiner*—John McQuade
*Assistant Examiner*—Gary F. Paumen

[57] ABSTRACT

An electrical socket includes a molded insulative base carrying rows of resilient electrical terminals. A leadless chip carrier initially is supported on the terminals, with the pads of the carrier engaging the terminals. A lid is placed over the carrier and is rotatably advanced to press against the carrier, causing the carrier to deflect resiliently the terminals, and to seat against the base. The lid clamps the carrier against the base and is adjustable to accommodate a carrier which varies in height within specified tolerances.

7 Claims, 8 Drawing Figures

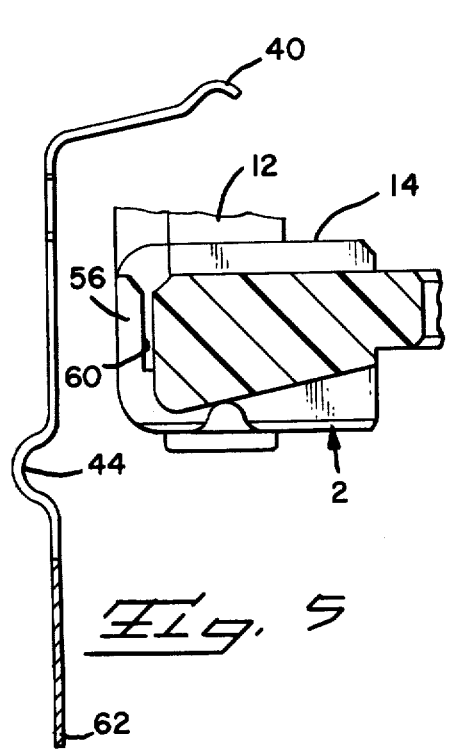
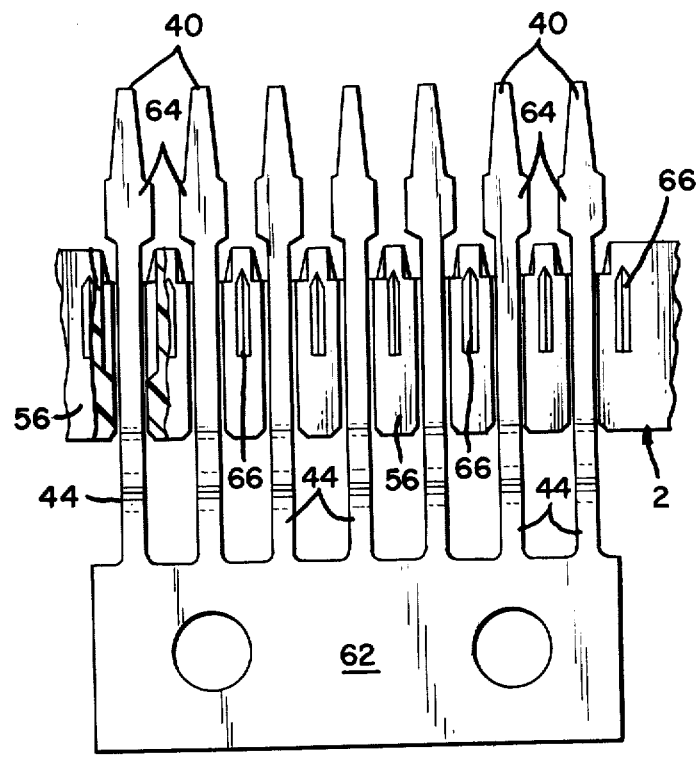
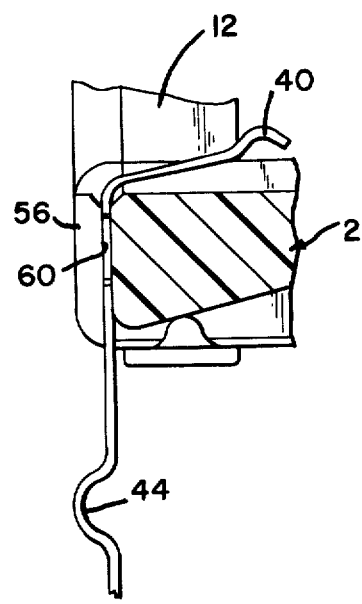
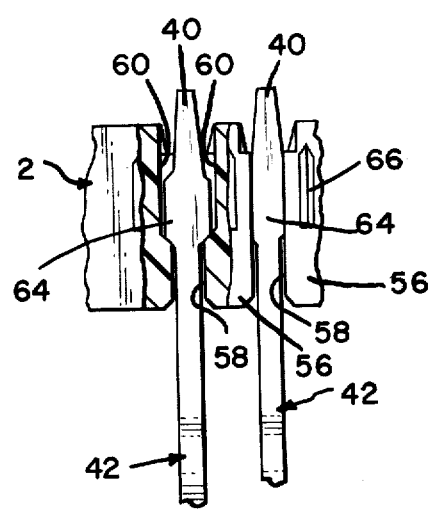

SOCKET FOR A CERAMIC CHIP CARRIER

FIELD OF THE INVENTION

The present invention relates to an electrical socket for mounting a leadless chip carrier on a circuit board.

BACKGROUND OF THE INVENTION

A standardized chip carrier is formed from a thin ceramic metalized with circuit pads extending to its sides and along the edges of the bottom surface. The sides meet at three chamfered corners and one square corner. An electronic circuitry chip is mounted on the ceramic carrier. Fine wires are bonded between the circuitry and the pads of the ceramic carrier. The chip and its wires are encapsulated within an inverted, shallow cover which, when mounted on the ceramic carrier, provides a second, smaller tier of a fully assembled, two tier chip carrier. The overall height of the carrier is allowed to vary within specified tolerances. Accordingly, a socket must accommodate carriers of varied height.

SUMMARY OF THE INVENTION

A socket according to the invention includes a molded holder having a nesting pocket for aligning a ceramic chip carrier without rotation. Initially the carrier is supported on resilient spring contacts. A removable lid is applied over the carrier, using a screwdriver to press the lid against the carrier and the carrier against the contacts, resiliently deflecting the contacts until the carrier becomes seated against the holder. Rotation of the screwdriver advances a helical ridge of the lid against latching flanges of the holder to tighten the lid in place, and simultaneously adjust for the height of the chip carrier. The elastic memory inherent in the lid maintains resilient pressure of the lid against the chip carrier.

Assembly of the contacts to the holder is facilitated by maintaining the contacts along a common carrier strip, while assembling the contacts into pockets molded in the carrier. Heat is applied to flow the molded material and close the pockets tightly against the contacts.

OBJECTS

An object of the present invention is to provide a socket which mounts a chip carrier against resilient contacts of the socket, and which utilizes a lid to clamp the carrier against a holder portion of the socket.

Another object is to provide a socket for a chip carrier, in which a removable lid of the socket is adjustable to accommodate carriers of varied height.

Another object is to provide a socket for a chip carrier in which electrical contacts are assembled in tightly closed pockets encircling a molded nest that retains the carrier without rotation.

Other objects and advantages of the present invention will be apparent from the following detailed description taken in conjunction with the drawings.

DESCRIPTION OF THE DRAWINGS

FIG. 4 is an enlarged fragmentary elevation of contacts in the process of assembly into pockets of the socket shown in FIG. 1, with the holder partially cut away to show one of the pockets in detail.

FIG. 5 is a fragmentary side view of the subject matter of FIG. 4.

FIG. 6 is a view similar to FIG. 4 illustrating insertion of the contacts in the pockets.

FIG. 7 is a fragmentary side view in section of the subject matter of FIG. 6.

DETAILED DESCRIPTION

Figure 1:
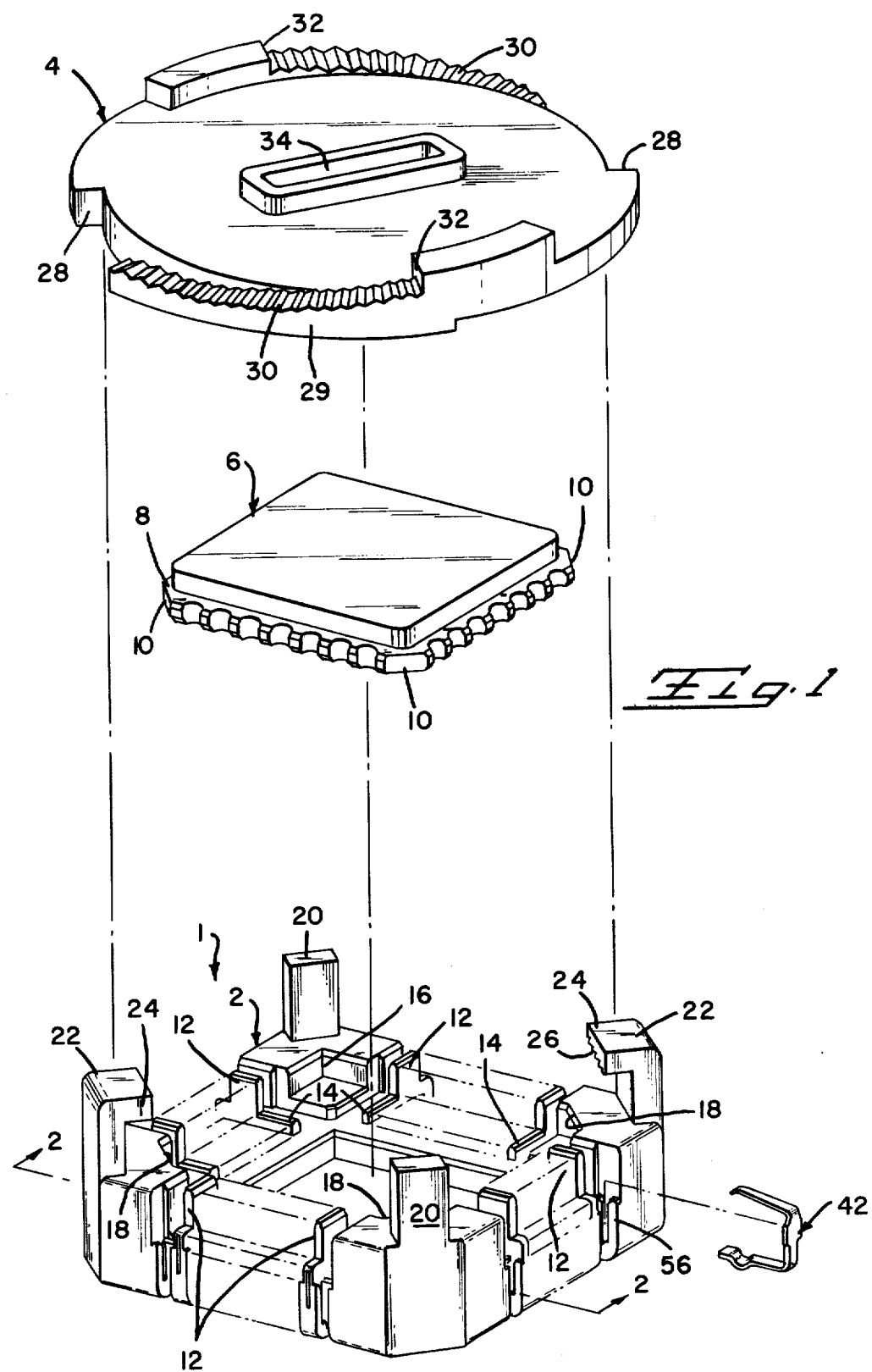
FIG. 1 is an enlarged perspective of a preferred embodiment of a socket according to the present invention with parts exploded for clearer illustration.

FIG. 1 illustrates a socket 1 comprising a holder 2 and a lid 4, each molded in one piece from a suitable plastic material. The holder is constructed to mount thereon a ceramic chip carrier 6 of two tier configuration. The tier 8 is ceramic, the side edges of which are perforated to facilitate separation from a large ceramic piece, much in the same manner that postage stamps are perforated for separation from one another. Three of the four corners 10 are chamfered to identify its mechanical polarity.

The holder 2 is molded along each of its sides with rows of evenly spaced apart partition walls 12 which are stepped down at 14 and define a recessed nest, the corners of which are either square at 16 or chamfered at 18 for complementary receipt of the chamfered corners 10 of the carrier 6. When the carrier is recessed in the nest, the corners and sides of the nest retain the sides of the carrier within closely controlled dimensional allowances, permitting no rotation of the carrier. The nest corners are adjacent upstanding corner posts 20 and 22. The posts 22 are molded with overhang flanges 24 projecting toward each other. An inverted friction surface 26 of each flange 24 is sloped, and further is molded along its slope with a series of doubly sloped, wedge shaped teeth.

The lid 4 is disc shaped, generally, with a diameter which fits freely in the span between the posts 20, when the posts 20 are diametrically opposed across the lid. The rim of the lid is provided with radially inset recesses 28 which provide clearances for receiving the posts 22 when the lid is assembled over the carrier 6 and the holder 2. Adjacent each recess, the rim is molded with an inclined wedge ridge 29 having a sloped friction surface 30, inclined helically counterclockwise, with an angle of inclination matching that of the surface 26 of a respective post 22. Doubly sloped teeth are provided along the slope of each portion 30. A stop shoulder 32 projects at the most elevated end of each portion 30 remote from the respective recess 28. A screwdriver receiving slot 34 is provided centrally of the lid 4.

Figure 2:
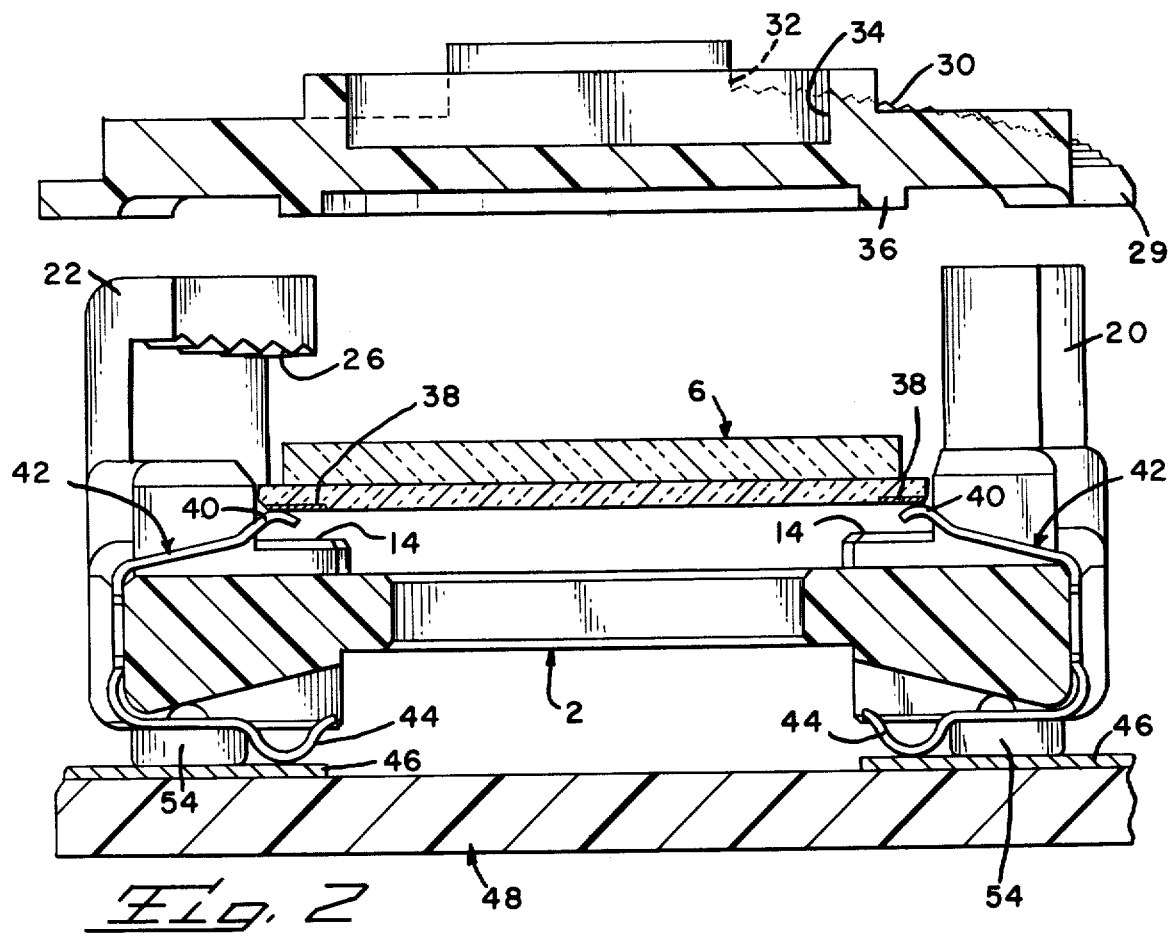
FIG. 2 is an enlarged elevation in section along the line 2—2 of FIG. 1, illustrating a ceramic chip carrier supported initially against electrical contacts and with a lid in readiness for assembly against the carrier.
Figure 3:
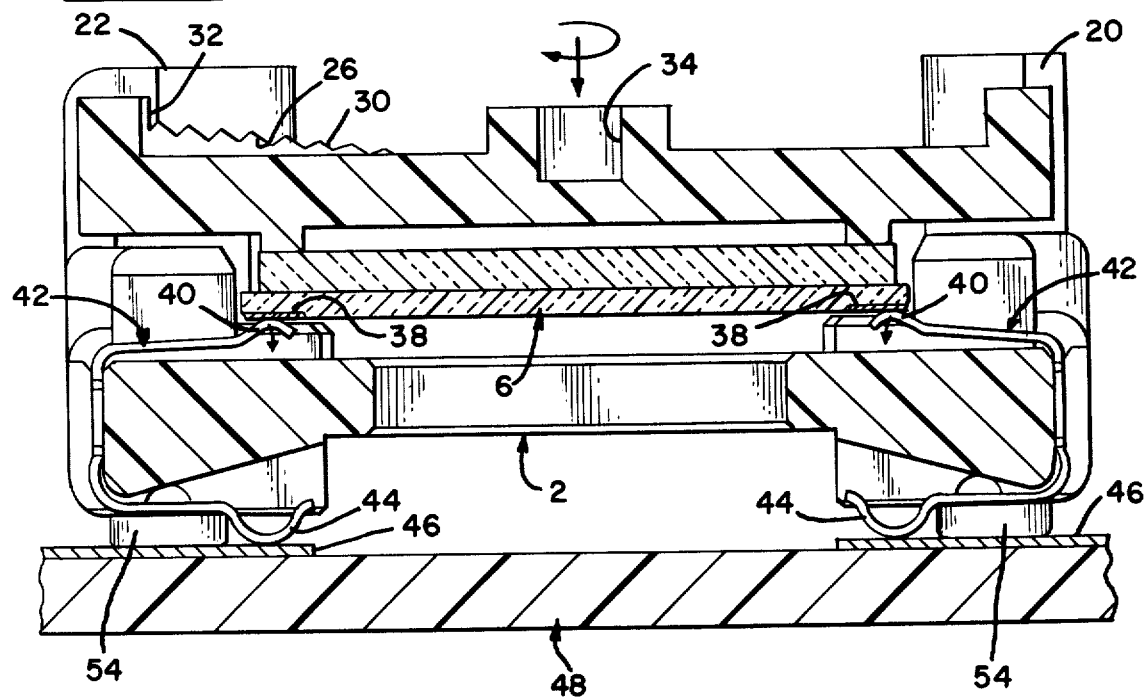
FIG. 3 is a view similar to FIG. 2 with the socket assembled on a circuit board and the lid in the process of being urged toward and against the carrier.

FIGS. 2 and 3 more particularly illustrate the underside of lid 4 molded with a projecting, ring flange 36 to engage against the top tier of the carrier 6. The flange 36 is radially inward of the friction surfaces 30 and stands off the remainder of the lid 4 from the carrier 6.

As shown in FIG. 2, the chip carrier 6 initially is assembled in the nest of holder 2 with its plated circuit pads 38 supported against free ends 40 of elongated, resilient spring contacts 42. The contacts initially support the entire chip carrier 6 away from the partition portions 14. The other free ends 44 of contacts 42 resiliently engage, and thereby make electrical connections with, conductive circuits 46 of a circuit board 48 such as a printed circuit board (PCB). In practice the free ends 44 are joined to the circuits 46 by solder joints.

FIG. 3 shows the lid 4 assembled over the chip carrier 6. A screwdriver blade (not shown) is inserted in the slot 34. Downward force is applied by the screwdriver against the lid, forcing the lid against the chip carrier, and forcing the chip carrier toward the partition portions 14, deflecting resiliently the contact free ends 40 into the spaces between the partition portions 14 and storing resilient spring energy. Simultaneously the lid is rotated clockwise by the screwdriver blade, traversing the friction surfaces 30 along the surfaces 26 and thereby wedging the ridges of the lid under the surfaces 26 and against the chip carrier 6. The holder nest prevents rotation of the chip carrier. The chip carrier deflects the contacts sufficiently that the carrier becomes seated and clamped against the partition portions 14. The rotated position of the lid aligns and wedges the ridges 29 under the surface 26, compensating for chip carriers of varied thicknesses. The stops 32 will engage the posts 22 to limit rotation of the lid. The teeth of the friction surfaces interengage to lock the lid in place. Even without the teeth, the friction surfaces 26 and 30 frictionally interengage to maintain the lid in place. Posts 20 also maintain the lid from skidding away from under the posts 22. The lid itself may be cupped radially outward from its flange 36 to its friction surfaces 30, engaged against the surfaces 26. When wedged, the lid becomes partially flattened to store some resilient spring energy. When the lid is removed from the chip carrier 6, the stored energy in the deflected contacts 42 will lift the chip carrier 6 partially from the holder nest to facilitate grasping of the chip carrier and removal from the assembly.

Figure 8:
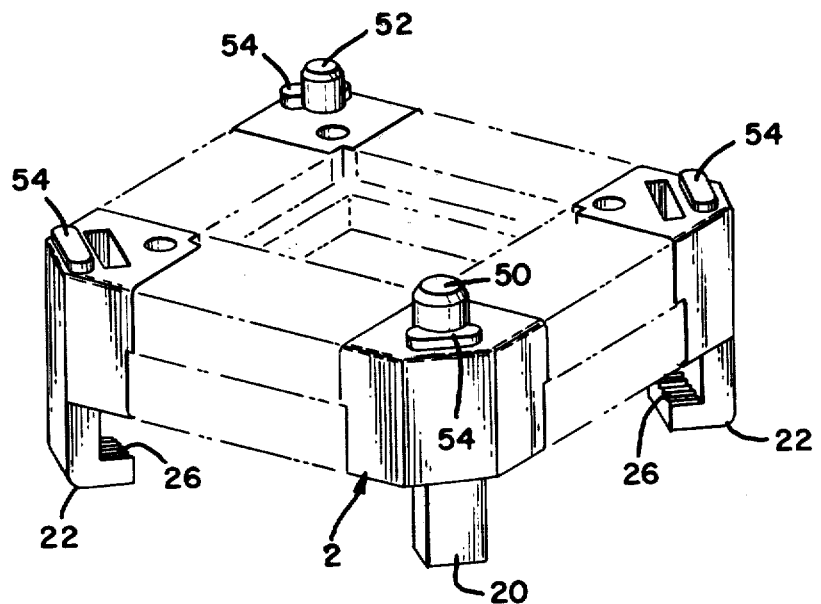
FIG. 8 is a perspective of the socket inverted, with parts illustrated in phantom outline.

FIG. 8 shows the holder 2 molded with projecting pins 50 and 52 of different diameters for plugging into accurately located and sized apertures (not shown) in the circuit board 48. The pins also absorb the forces applied by a screwdriver, preventing the forces from being applied to the aforementioned solder joints. Additionally the four corners of the holder are provided with projecting feet 54 which support the holder on the circuit board, slightly raised above the circuit board to prevent entrapment of contaminants during cleaning and rinsing operations.

FIGS. 4-7 illustrate the sides of holder 2 provided with rows of barrier walls 56 defining therebetween groove passageways 58 communicating with widened pockets 60 partially overlapped on both sides by respective walls 56. Contacts 42 are initially stamped and formed integral with and along a carrier strip 62. The narrow portions of the contacts are laid into the passageways 58. Widened portions 64 then are slid into respective pockets 60. Heat is applied against the barrier walls, for example, by a heated toolhead (not shown) seating in grooves 66 of the walls 56, causing the plastic material to flow, and collapse or close the pockets tightly on the contact portions 64. Upon solidification of the plastic material the contacts 42 will be rigidly mounted on the holder 2. Subsequently, the carrier strip 62 may be removed and the contact free ends 40 and/or 44 permanently bent to their positions shown in FIG. 2.

Although a preferred embodiment of the present invention is disclosed, other embodiments and modifications thereof which would be apparent to one having ordinary skill are intended to be covered by the spirit and scope of the appended claims.

What is claimed is:

1. A socket for a chip carrier, comprising:
   a base,
   electrical contacts mounted on said base for engaging a circuit board,
   insulative partitions on said base separating said contacts and providing a seat for said carrier,
   projecting posts on said base having undercut inclined flanges,
   a lid for clamping said carrier against said partitions and having inclined wedge ridges on which are friction surfaces contructed to engage said flanges,
   said contacts engaging said carrier and being resiliently deflected into spaces between said partitions upon said carriers being clamped against said partitions.

2. The structure as recited in claim 1, wherein said contacts initially support said carrier away from said partitions prior to deflection thereof.

3. The structure as recited in claim 1, wherein, said friction surfaces are curved, and said lid is rotatable to wedge said curved friction surfaces against said flanges.

4. The structure as recited in claim 1, wherein, means are provided on said friction surfaces for interengaging said flanges and locking said lid in place.

5. The structure as recited in claim 1, wherein, said contacts are mounted in pockets of said base and project outwardly therefrom to engage said carrier.

6. The structure as recited in claim 1, wherein, said lid has a projecting circular flange engageable and rotatable against said carrier.

7. The structure as recited in claim 6, wherein, said friction surfaces are radially spaced outwardly of said circular flange, said lid being resiliently radially deflected when wedged against said post flanges.

* * * * *